(12) United States Patent
Qian

(10) Patent No.: US 6,441,652 B1
(45) Date of Patent: Aug. 27, 2002

(54) HIGH EFFICIENCY HIGH FREQUENCY RESONANT GATE DRIVER FOR POWER CONVERTER

(75) Inventor: Jinrong Qian, Croton-on-Hudson, NY (US)

(73) Assignee: Koninklijke Philips Electroanics N.V., Eindhoven (NL)

(*) Notice: Subject to any disclaimer, the term of this patent is extended or adjusted under 35 U.S.C. 154(b) by 0 days.

(21) Appl. No.: 09/338,993

(22) Filed: Jun. 24, 1999

(51) Int. Cl.$^7$ ................................................. H03B 1/00
(52) U.S. Cl. ........................ 327/108; 327/365; 327/372
(58) Field of Search ................................ 327/108, 109, 327/110, 111, 372, 382, 344, 365; 330/251, 10, 207 A

(56) References Cited

U.S. PATENT DOCUMENTS

| | | | | |
|---|---|---|---|---|
| 4,052,623 A | * | 10/1977 | Loberg | 514/34 |
| 4,109,192 A | | 8/1978 | Burbank et al. | 320/1 |
| 4,358,654 A | | 11/1982 | Estes | 219/10.77 |
| 5,014,178 A | * | 5/1991 | Balakrishnan | 363/49 |
| 5,023,566 A | * | 6/1991 | El-Hamamsy et al. | 330/251 |
| 5,306,986 A | * | 4/1994 | Siao | 315/248 |
| 5,446,350 A | * | 8/1995 | El-Hamamsy et al. | 315/248 |
| 5,469,098 A | * | 11/1995 | Johnson, Jr. | 327/190 |
| 5,642,065 A | * | 6/1997 | Choi et al. | 327/110 |
| 5,804,943 A | | 9/1998 | Kollman et al. | 320/1 |
| 5,914,572 A | | 6/1999 | Qian et al. | 315/307 |

FOREIGN PATENT DOCUMENTS

EP   0568279 A1   11/1993 ......... H03K/17/687

* cited by examiner

Primary Examiner—Timothy P. Callahan
Assistant Examiner—Hai L. Nguyen

(57) ABSTRACT

A driver circuit for a high frequency switching circuit such as a converter for a gas discharge lamp includes a resonant circuit which transfers energy from the parasitic input capacitance of one or more power switching devices during switching of the latter. The energy transfer prevents dissipation of the capacitive energy in the driver circuit which may otherwise destroy one or more components of the driver circuit. The resonant circuit includes a discrete inductor in the driver circuit. Preferably, one or more discrete capacitors are also included within the driver circuit to maintain resonance at a given frequency regardless parasitic capacitance variation.

15 Claims, 3 Drawing Sheets

HIGH EFFICIENCY HIGH FREQUENCY RESONANT GATE DRIVER FOR POWER CONVERTER

BACKGROUND OF THE INVENTION

This invention relates generally to a resonant gate driver circuit for a power converter that may be used to drive a gas discharge lamp.

Parasitics in power semiconductor devices of switching power converters play a very important role in radio frequency switching applications. Gate circuits of power metal oxide semiconductor field effect transistors (MOSFETs), insulated gate bipolar transistors (IGNTs) and MOS-controlled thyristors (MCTs) have parasitic gate capacitance. The conventional way to drive these devices is through a driver circuit supplying a square wave voltage to the gate circuit. A pulse voltage is applied to turn the gate of the gate circuit on. During turn-on, the parasitic gate capacitance is charged. During turn-off, the charge stored in the parasitic gate capacitance is discharged through the driver circuit. Energy stored in the parasitic gate capacitance of the gate circuit power devices is completely dissipated by the driver circuit. For low switching frequency operation, the energy loss and consequential power consumed due to the parasitic gate capacitance is trivial. However, the energy loss can destroy the IC of the gate driver circuit when operated at a high frequency.

The total gate capacitive loss (i.e. power consumed) can be defined as:

$$Pg = Ciss \; Vc^2 \; fs.$$

For a switching frequency fs=3 MHz, a gate parasitic input capacitance Ciss=2000 pF, and a gate voltage Vc=12 V, the power consumed is 0.86 watts.

This substantial loss will destroy the driver circuit IC.

SUMMARY OF THE INVENTION

The invention solves this problem by recovering energy stored in the parasitic capacitance of the gate circuit to improve gate driver efficiency. For radio frequency applications such as electrodeless lamp ballast, and high frequency (e.g., greater than 1 MHz.) and high density power converters, high efficiency gate driver operation becomes crucial for performance of the power system.

According to the invention a resonant gate driver circuit for high frequency power converters uses parasitics of the gate circuit as a part of resonance elements and provides a sinusoidal gate voltage waveform to recycle energy stored in the parasitics of the gate circuit, resulting in a substantial loss reduction in energy losses with high efficiency operation. The advantages of such an inventive gate driver circuit over the conventional approach include an extremely low power dissipation in the gate driver circuit, and lossless switching of a power switching device of the resonant gate circuit.

The main objective of the present invention is to provide a new and efficient gate driver circuit for high frequency power converters, especially for electrodeless lamp ballasts and high power density DC/DC, AC/DC and DC/AC converters operating in and above megahertz switching frequencies.

As mentioned above, with a square wave voltage applied to the gate of the power device in the gate circuit operated at high frequencies, the total charge stored in the parasitic gate input capacitance is completely dissipated by the gate driver circuit itself, which will destroy components of the gate driver circuit. To reduce loss in and improve the efficiency of the gate driver circuit, energy stored in the parasitic input capacitance of the gate circuit is recovered by providing a resonant circuit formed, in part, from the parasitic input capacitance.

In one embodiment, at least one discrete or external (i.e., non-parasitic) resonant inductor is inserted into the gate driver circuit to form a resonant tank with the parasitic input gate capacitance. In that case, during turn off the power switching device, such as MOSFET, energy stored in the input gate capacitance thereof will be transferred to the inductor, and during turn on, the energy stored in the resonant inductor will be transferred again to charge the parasitic input gate capacitance of the power switching device. Thus, energy stored in the parasitic gate input capacitance is recycled every switching period, instead of being dissipated by the gate driver circuit. As a consequence, driver circuit efficiency can be significantly improved.

At least one discrete or external (i.e., non-parasitic) capacitance is preferably also added in the tank circuit to eliminate the effects of variations in the parasitic input capacitance due, e.g., to tolerances from device to device.

DETAILED DESCRIPTION OF THE PREFERRED EMBODIMENTS

Figure 1:
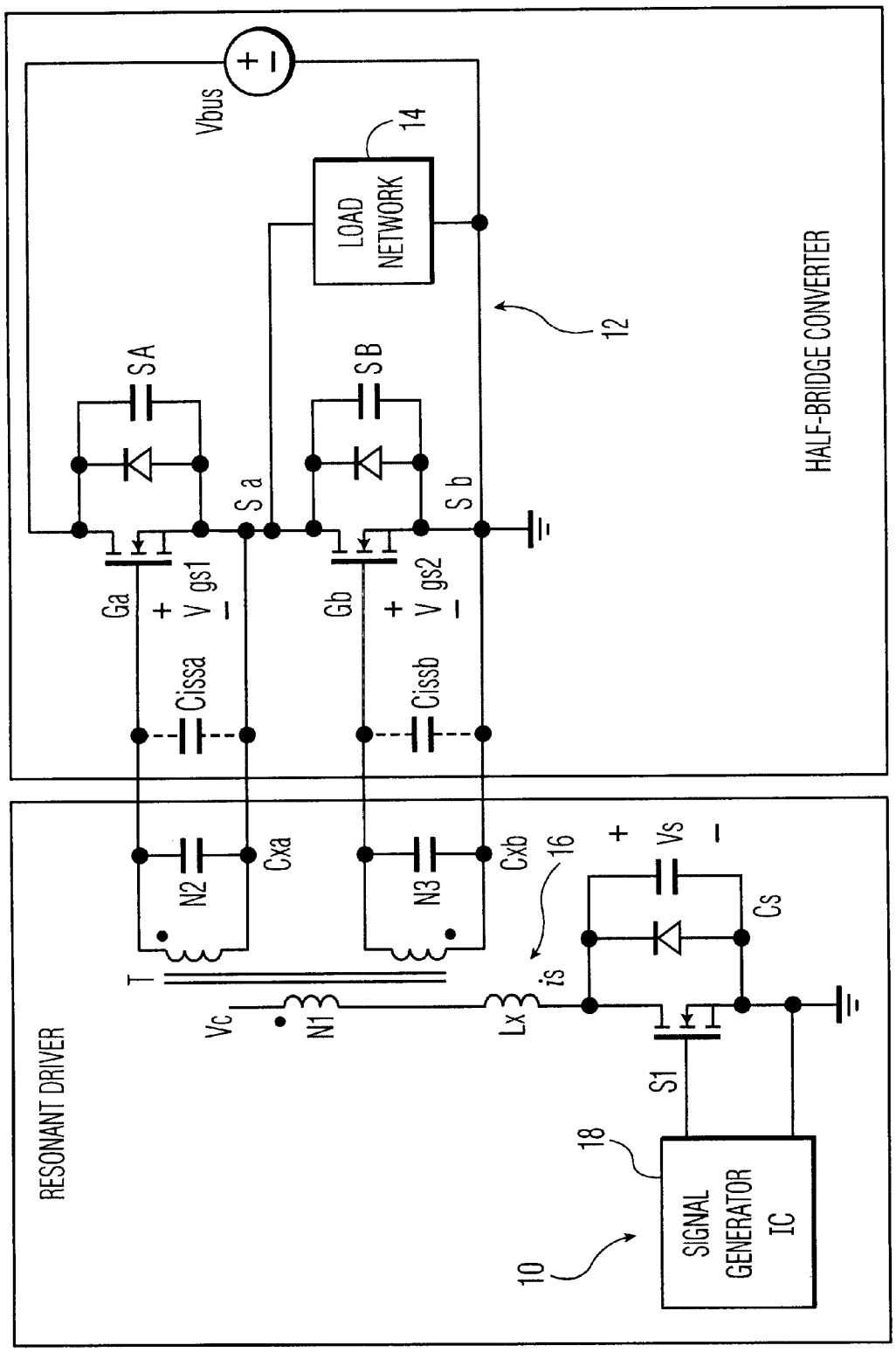
FIG. 1 is a schematic representation of one embodiment of the invention.

FIG. 1 shows one implementation of a resonant gate circuit driver 10 for a half-bridge converter 12. The converter 12 includes MOSFET power switches SA and SB, which is connected to a load network 14. The gate driver circuit 10 includes a resonant tank circuit 16 which includes inductor Lx, the parasitic gate input capacitances Cissa and Cissb of transistor power switches SA and SB, respectively, and external (discrete) capacitors Cxa and Cxb on the secondary side of the isolation transformer T. The inductor Lx represents the resonant inductor and includes the leakage inductance of the isolation transformer T and an added (discrete) inductance. The external capacitors Cxa and Cxb and parasitic gate input capacitors Cissa and Cissb form together the resonant capacitor.

The capacitance of the external capacitors Cxa, Cxb is much larger than the capacitances of parasitic gate input capacitors Cissa Cissb, respectively, to eliminate the effects in gate input capacitance variations due, e.g., to device tolerances. Two secondary windings N2 and N3 of the isolation transformer T are out of phase with each other and their output voltages are used to drive power switches SA, SB in a half-bridge arrangement.

A transistor switch S1 in the driver circuit 10 operates in a zero voltage switching mode. A very slow rate of change in the drain-source voltage occurs when switch S1 turns off because a large capacitor Cs is added in parallel with switch Si. The power consumed by switch S1 is very low. The signal generator IC 18 provides a high frequency control signal for the switch S1. The switching frequency can be easily adjusted through a timing resistor in IC 18. Since the current and voltage ratings of the switch S1 are relatively small, the power loss associated with driving the switch S1 can be neglected. By using this driving scheme, the loss in the gate driver circuit can be reduced about 50% compared with the conventional square wave driving approach.

The resonant gate driver circuit 10 was successfully implemented in 2.65 MHz, 85 W and 165 W an electrodeless lamp ballast using an IC 3875 signal generator 18, MTP 3n50 (Motorola 3A/500V) power MOSFETs SA, SB, a VN106n3 S1 switch, and tank circuit values of Lx=2.7 uh, Cxa, Cxb=1.5 uF, and Cs=1.5 uF. The resonant gate driver 10 can also be used in any high frequency high density power converter.

Figure 2:
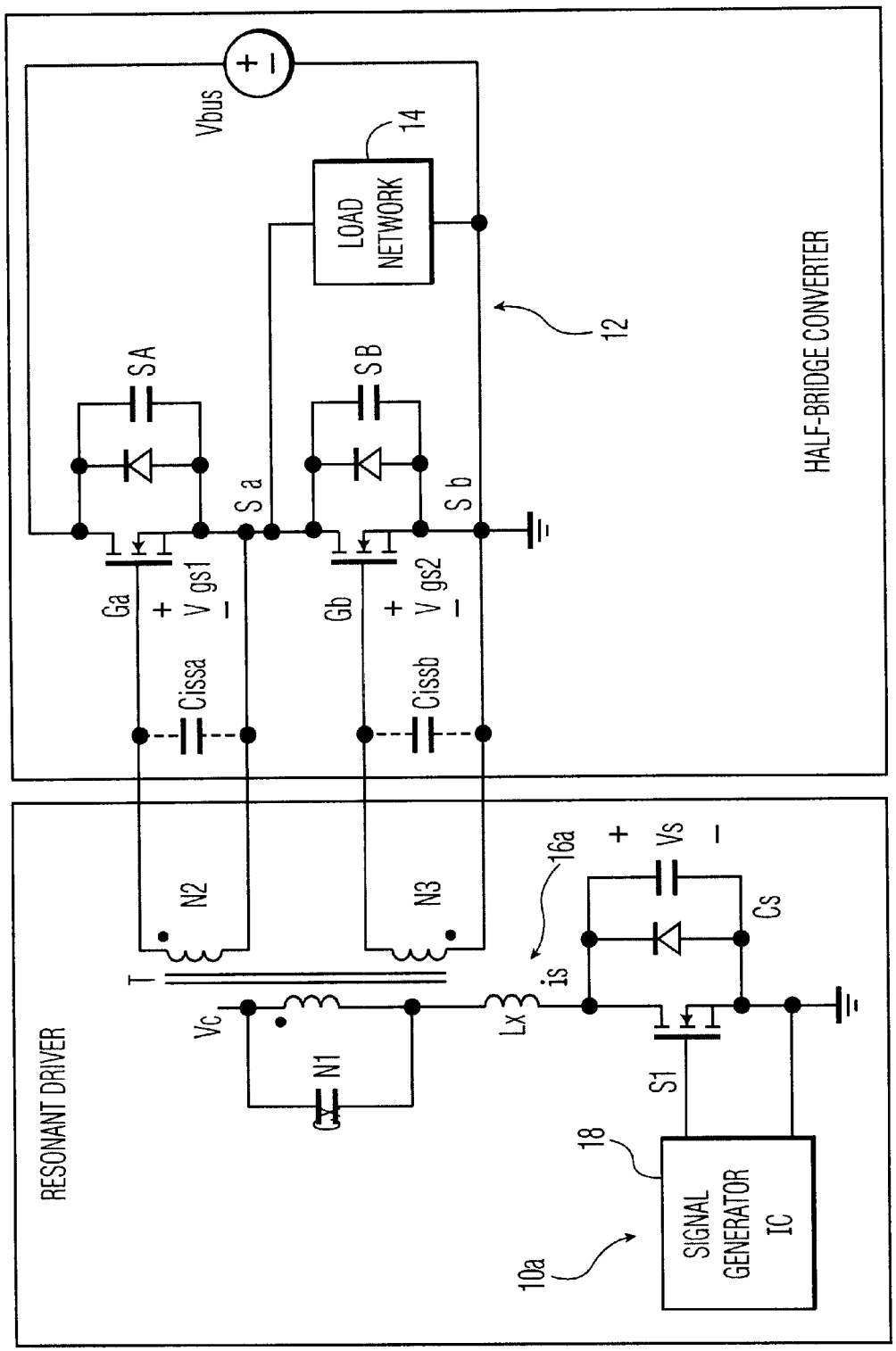
FIG. 2 is a schematic representation of another embodiment of the invention.
Figure 3:
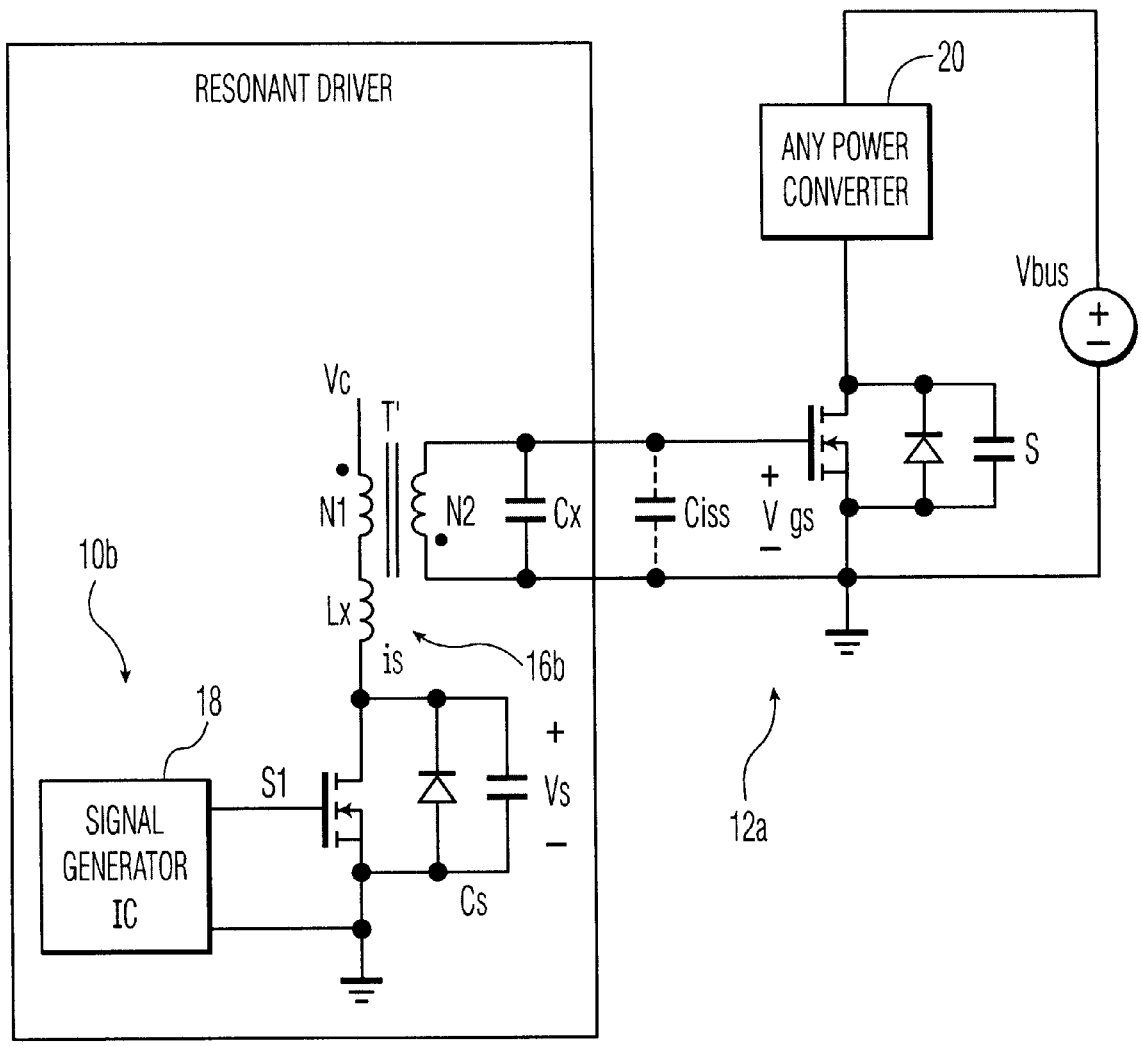
FIG. 3 is a schematic representation of another embodiment of the invention.

FIG. 2 shows an alternative embodiment of a resonant gate circuit driver circuit 10a where the external resonant capacitors Cxa and Cxb are connected on the primary side. FIG. 3 shows yet another alternative embodiment of a resonant gate driver circuit 10b for single switch applications. An isolation transformer T' has only one secondary winding for driving the single power switch S for use with any suitable power converter 20.

All three embodiments provide a high efficiency resonant gate driver circuit with about 50% reduction in loss using an IC signal generator (controller) as compared to the conventional square wave driving approach. The gate driver circuits 10, 10a and 10 make possible operation of the power converters at a switching frequency above 1 MHz. Both size and volume of the converter can be reduced. Power density and thermal management can be improved.

For the electrodeless lamp ballast applications, a tuning inductor is currently used to manually adjust the switching frequency to match the lamp driving circuit. By using the resonant gate driver circuit in accordance with the invention, the IC signal generator can be used instead to adjust the switching frequency to match the lamp driving circuit. The manually tuned inductor can be eliminated.

The preceding specific embodiments are illustrative of the practice of the invention. It is to be understood, however, that other expedients known to those skilled in the art or disclosed herein, may be employed without departing from the spirit of the invention or the scope of the appended claims.

What is claimed is:

1. A driver circuit for a switching circuit having at least one power switching device which has a parasitic input capacitance, comprising:
    a signal generator providing a high frequency driving signal;
    a first switching device coupled to the signal generator for receiving the high frequency driving signal and driving the at least one power switching device;
    a resonant circuit operably coupled in series with a power source and the first switching device and to the at least one power switching device, which includes as part thereof the parasitic input capacitance of the at least one power switching device, wherein the resonant circuit transfers energy from the parasitic input capacitance during turn off of the at least one power switching device and transfers energy to the at least one power switching device during turn on of the at least one power switching device.

2. The driver circuit according to claim 1 wherein the resonant circuit includes at least one discrete inductor.

3. The driver circuit of claim 2, wherein
    the at least one discrete inductor is connected in series between the power source and the first switching device.

4. The driver circuit according to claim 1 wherein the resonant circuit includes at least one discrete capacitor.

5. The driver circuit of claim 4, wherein
    the at least one discrete capacitor is connected in parallel to the parasitic input capacitors.

6. The driver circuit according to claim 1 wherein the driver circuit includes a transformer coupling the first switching device and the power switching device together, and wherein the resonant circuit includes at least one discrete capacitor coupled on a primary side of the transformer.

7. The driver circuit according to claim 6 wherein the resonant circuit includes at least one discrete inductor coupled on the primary side of the transformer.

8. The driver circuit according to claim 1 comprising first and second power switching devices coupled to the first switching device.

9. The driver circuit according to claim 1 wherein the switching circuit serves as a gas discharge lamp ballast converter.

10. The driver circuit according to claim 1 wherein the driver circuit includes a transformer for coupling the first switching device and the at least one power switching device together, and wherein the resonant circuit includes at least one discrete capacitor coupled on a secondary side of the transformer.

11. The driver circuit according to claim 10 wherein the resonant circuit includes at least one discrete inductor coupled on the primary side of the transformer.

12. The driver circuit of claim 10, wherein
    the at least one discrete capacitor is connected in parallel to the parasitic input capacitor.

13. The driver circuit of claim 10, wherein
    the transformer is connected in series between the power source and the first switching device.

14. A driver circuit comprising:
    a signal generator,
    a switching device, operably coupled to the signal generator, that is configured to receive a switching control signal from the signal generator,
    an inductive device that is connected in series between a power source and the switching device, such that current flows through the inductive device when the switching device is placed in a conducting state, and
    at least one power switching device, operably coupled to the inductive device, that has a parasitic input capacitance;
    wherein
    the parasitic input capacitance and the inductive device are each a part of a common resonant circuit.

15. The driver circuit of claim 14, further including
    at least one other capacitive device that forms another part of the common resonant circuit.

* * * * *